US008631269B2

(12) United States Patent
Vinayak et al.

(10) Patent No.: US 8,631,269 B2
(45) Date of Patent: Jan. 14, 2014

(54) METHODS AND SYSTEM FOR REPLACING A FAILED NODE IN A DISTRIBUTED STORAGE NETWORK

(75) Inventors: Rashmi Korlakai Vinayak, Karnataka (IN); Nihar B. Shah, Karnataka (IN); P. Vijay Kumar, Karnataka (IN)

(73) Assignee: Indian Institute of Science, Karnataka (IN)

( * ) Notice: Subject to any disclaimer, the term of this patent is extended or adjusted under 35 U.S.C. 154(b) by 211 days.

(21) Appl. No.: 13/110,534

(22) Filed: May 18, 2011

(65) Prior Publication Data

US 2011/0289351 A1 Nov. 24, 2011

(30) Foreign Application Priority Data

May 21, 2010 (IN) .......................... 1421/CHE/2010

(51) Int. Cl.
*G06F 11/00* (2006.01)

(52) U.S. Cl.
USPC ......................................... 714/4.11; 714/6.2

(58) Field of Classification Search
USPC ....................................................... 714/4.11
See application file for complete search history.

(56) References Cited

U.S. PATENT DOCUMENTS

| 7,346,734 | B2* | 3/2008 | Chen et al. ..................... 711/114 |
| 7,418,620 | B1* | 8/2008 | Tormasov et al. ........... 714/6.24 |
| 7,536,693 | B1* | 5/2009 | Manczak et al. .............. 718/105 |
| 7,681,105 | B1* | 3/2010 | Sim-Tang et al. ............. 714/763 |
| 7,739,233 | B1* | 6/2010 | Ghemawat et al. ........... 707/610 |
| 7,761,663 | B2* | 7/2010 | Frolund et al. ................ 711/119 |
| 7,783,600 | B1* | 8/2010 | Spertus et al. ................. 707/622 |
| 7,818,430 | B2* | 10/2010 | Zuckerman et al. .......... 709/226 |
| 7,904,782 | B2* | 3/2011 | Huang et al. ................... 714/752 |
| 7,930,611 | B2* | 4/2011 | Huang et al. ................... 714/752 |
| 8,051,362 | B2* | 11/2011 | Li et al. ........................ 714/776 |
| 8,145,941 | B2* | 3/2012 | Jacobson ..................... 714/6.24 |
| 8,266,493 | B1* | 9/2012 | Abbaszadeh et al. ......... 714/752 |
| 8,281,182 | B2* | 10/2012 | Resch et al. .................... 714/6.2 |
| 8,375,102 | B2* | 2/2013 | Medard et al. ................ 709/217 |
| 8,386,840 | B2* | 2/2013 | Stougie et al. ................. 714/6.2 |
| 2002/0016943 | A1* | 2/2002 | Hunt ............................... 714/755 |
| 2002/0078244 | A1* | 6/2002 | Howard ........................ 709/248 |
| 2007/0136525 | A1* | 6/2007 | Read .............................. 711/114 |
| 2007/0192544 | A1* | 8/2007 | Frolund et al. ................ 711/135 |
| 2007/0208748 | A1* | 9/2007 | Li .................................... 707/10 |
| 2007/0208760 | A1* | 9/2007 | Reuter et al. .................. 707/100 |

(Continued)

OTHER PUBLICATIONS

Patterson et al., "A Case for Redundant Arrays of Inexpensive Disks (RAID)," University of California, Department of Electrical Engineering and Computer Science, Jun, 1988, pp. 109-116.

(Continued)

*Primary Examiner* — Kamini Patel
(74) *Attorney, Agent, or Firm* — Oliff & Berridge, PLC (57) ABSTRACT

Embodiments of the disclosure relate to a system and method for replacing a failed node in a distributed data storage network. The network includes storage nodes storing source data amongst them in a redundant manner that is coded using one of minimum-storage, minimum-bandwidth or twin code techniques. On failure of a storage node, means of obtaining the data of the failed node from the existing nodes are described, under each of these coding techniques. This action is performed in a manner that requires a minimal amount of download. The storage space required in the nodes is also minimized.

12 Claims, 6 Drawing Sheets

(56) References Cited

U.S. PATENT DOCUMENTS

| | | | |
|---|---|---|---|
| 2007/0214314 A1* | 9/2007 | Reuter | 711/114 |
| 2008/0065975 A1* | 3/2008 | Massoulie et al. | 715/201 |
| 2008/0222480 A1* | 9/2008 | Huang et al. | 714/752 |
| 2008/0222481 A1* | 9/2008 | Huang et al. | 714/752 |
| 2008/0313241 A1* | 12/2008 | Li et al. | 707/202 |
| 2010/0094957 A1* | 4/2010 | Zuckerman et al. | 709/219 |
| 2011/0113282 A1* | 5/2011 | De Spiegeleer et al. | 714/6.13 |
| 2011/0173162 A1* | 7/2011 | Anderson et al. | 707/692 |

OTHER PUBLICATIONS

Rhea et al., "Pond: The OceanStore Prototype," *Proceedings of the 2nd USENIX Conference on File and Storage Technologies (FAST)*, 2003, pp. 1-14.

Bhagwan et al., "Total Recall: System Support for Automated Availability Management," *Proceedings of the 1st conference on Symposium on Networked Systems Design and implementation (NSDI)*, 2004.

Dimakis et al.,"Network Coding for Distributed Storage Systems," *Proceedings of the 26th IEEE International Conference on Computer Communications (INFOCOM)*, May 2007, pp. 2000-2008.

Wu et al., "Deterministic Regenerating Codes for Distributed Storage," *Proceedings of the 45th Annual Allerton Conference on Control, Computing, and Communication*, Sep. 2007.

Shah et al., "Explicit Codes Minimizing Repair Bandwidth for Distributed Storage," *Proceedings of the IEEE Information Theory Workshop (ITW)*, Jan. 2010, pp. 1-11.

Suh et al., "Exact-Repair MDS Codes for Distributed Storage Using Interference Alignment," *Proceedings of the IEEE International Symposium on Information Theory (ISIT)*, Jun. 2010, pp. 161-165.

Wu, "Existence and Construction of Capacity-Achieving Network Codes for Distributed Storage," *IEEE Journal on Selected Areas in Communications*, vol. 28, No. 2, 2010, pp. 1150-1154.

Dimakis et al., "Network Coding for Distributed Storage Systems," *IEEE Transactions on Information Theory*, vol. 56, No. 9, pp. 1-13, 2010.

Duminuco et al., "A Practical Study of Regenerating Codes for Peer-to-Peer Backup Systems," *Proceedings of the 29th IEEE International Conference on Distributed Computing Systems (ICDCS)*, Jun. 2009, pp. 376-384.

Wu et al., "Reducing Repair Traffic for Erasure Coding-Based Storage via Interference Alignment," *Proceedings of the IEEE International Symposium on Information Theory (ISIT)*, Jul. 2009, pp. 2276-2280.

Rashmi et al., "Explicit Construction of Optimal Exact Regenerating Codes for Distributed Storage," *Proceedings of the 47th Annual Allerton Conference on Communication, Control, and Computing*, Sep. 2009, pp. 1243-1249.

Cullina et al., "Searching for Minimum Storage Regenerating Codes," *Proceedings of the 47th Annual Allerton Conference on Communication, Control, and Computing*, Sep. 2009.

Shah et al., "Interference Alignment in Distributed Storage Regenerating Codes: Necessity and Code Constructions," *IEEE Transactions on Information Theory*, submitted for publication. [Online], pp. 1-38, Apr. 2012.

Wu, "A Construction of Systematic MDS Codes with Minimum Repair Bandwidth," *IEEE Transactions on Information Theory*, submitted for publication. [Online], pp. 1-4, Jun. 2011.

Cadambe, "Distributed Data Storage with Minimum Storage Regenerating Codes—Exact and Functional Repair are Asymptotically Equally Efficient," University of California Irvine, Apr. 24, 2010.

Suh et al., "On the Existence of Optimal Exact-Repair MDS Codes for Distributed Storage," *Wireless Foundations*, University of California at Berkeley, Apr. 28, 2010, pp. 1-20.

Shah et al., "A Flexible Class of Regenerating Codes for Distributed Storage," *Proceedings of the IEEE International Symposium on Information Theory (ISIT)*, Jun. 2010, pp. 1-5.

Shah et al., "Distributed Storage Codes with Repair-by-Transfer and Non-achievability of Interior Points on the Storage-Bandwidth Tradeoff," *IEEE Transactions on Information Theory*, submitted for publication. [Online], Jun. 2010, pp. 1-30.

Maddah-Ali et al., "Communication over MIMO X Channels: Interference Alignment, Decomposition, and Performance Analysis," *IEEE Transactions on Information Theory*, vol. 54, No. 8, pp. 3457-3470, 2008.

Cadambe et al., "Interference Alignment and Spatial Degrees of Freedom for the $k$ User Interference Channel," *IEEE Transactions on Information Theory*, vol. 54, No. 8, pp. 3425-3441, Aug. 2008.

Dimakis et al., "Network Coding for Distributed Storage Systems," *IEEE Trans. on Information Theory*, vol. 56, No. 9, pp. 4539-4551, 2010, pp. 1-11.

Rashmi et al., "Optimal Exact—Regenerating Codes for Distributed Storage at the MSR and MBR Points via a Product-Matrix Construction," IEEE Trans. on Inf. Theory, submitted for publication. [Online], Aug. 2011.

Wang et al., "Rebuilding for Array Codes in Distributed Storage Systems," *ACTEMT*, Dec. 2010.

Elias, "Error-free Coding,"*IRE Transactions on Information Theory*, vol. 4, No. 4, pp. 1-12, Sep. 1954, Technical Report 285.

* cited by examiner

METHODS AND SYSTEM FOR REPLACING A FAILED NODE IN A DISTRIBUTED STORAGE NETWORK

TECHNICAL FIELD

Embodiments of the present disclosure relate to distributed storage networks. More particularly, the embodiments relate to an optimized distributed storage system for repairing failed storage nodes and reconstructing the source data from the data stored in subsets of nodes.

BACKGROUND

In a distributed storage system, information pertaining to a data file is dispersed across nodes in a network in such a manner that an end-user can retrieve the data stored by tapping into a subset of the nodes. A popular option that reduces network congestion and that leads to increased resiliency in the face of node failures, is to employ erasure coding, for example by calling upon maximum-distance-separable (MDS) codes such as Reed-Solomon (RS) codes. Let B be the total file size measured in terms of symbols over a finite field $F_q$ of size q. With RS codes, data is stored across n nodes in the network in such a way that the entire data can be recovered by a data collector by connecting to any k nodes, a process of data recovery that we will refer to as reconstruction. Several distributed storage systems such as RAID-6, OceanStore and Total Recall employ such an erasure-coding option.

Regenerating algorithms or codes in a distributed storage network perform the regeneration of a failed node. Upon failure of an individual node, a self-sustaining data-storage network must necessarily possess the ability to regenerate (or repair) a failed node. An obvious means to accomplish this is to permit the replacement node to connect to any k nodes, download the entire data, and extract the data that was stored in the failed node. But downloading the entire B units of data in order to recover the data stored in a single node that stores only a fraction of the entire data file is wasteful, and raises the question as to whether there is a better option.

Conventional RS codes treat each fragment stored in a node as a single symbol belonging to the finite field $F_q$. It can be shown that when individual nodes are restricted to perform only linear operations over $F_q$, the total amount of data download needed to repair a failed node can be no smaller than B, the size of the entire file. In contrast, regenerating codes are codes over a vector alphabet and hence treat each fragment as being comprised of a symbols over the finite field $F_q$. Linear operations over $F_q$ in this case, permit the transfer of a fraction of the data stored at a particular node. Apart from this new parameter α, two other parameters (d, β) are associated with regenerating codes. Under the definition of regenerating codes, a failed node is permitted to connect to a fixed number d of the remaining nodes while downloading β≤α symbols from each node. This process is termed as regeneration and the total amount dβ of data downloaded for repair purposes as the repair bandwidth. Typically, with a regenerating code, the average repair bandwidth is small compared to the size of the file B.

It will be assumed throughout the description, that for [n, k, d] regenerating code, k, d are the minimum values under which reconstruction and regeneration can always be guaranteed. This restricts the range of d to $$k \le d \le n-1 \qquad (1)$$

The first inequality arises because if the regeneration parameter d were less than the data-reconstruction parameter k then one could, in fact, reconstruct data by connecting to any d<k nodes (treating the data stored in every other node as a function of that stored in these d nodes) thereby contradicting the minimality of k. Finally, while a regenerating code over $F_q$ is associated with the collection of parameters $$\{n,k,d,\alpha,\beta,B\}$$

it will be found more convenient to regard parameters {n, k, d} as primary and {α, β, B} as secondary and thus we will make frequent references in the sequel, to a code with these parameters as an [n, k, d] regenerating code having parameter set (α, β, B).

Exact versus Functional Regeneration: In the context of a regenerating code, by functional regeneration of a failed node v, we will mean, replacement of the failed node by a new node v' in such a way that following replacement, the resulting network of n nodes continues to possess the reconstruction and regeneration properties. In contrast, by exact regeneration means replacement of a failed node v by a replacement node v' that stores exactly the same data as was stored in node v. An exact-regenerating code is a regenerating code that has the capability of exactly regenerating each instance of a failed node. Clearly where it is possible, an exact-regeneration code is to be preferred over a functional-regeneration code since under functional regeneration; there is need for the network to inform all nodes in the network of the replacement, whereas this is clearly unnecessary under exact regeneration.

Cut-Set Bound and the Storage-Repair-Bandwidth Tradeoff has a major result in the field of regenerating codes, that uses the cut-set bound of network coding to establish that the parameters of a functional regenerating code must necessarily satisfy:

$$B \le \sum_{i=0}^{k-1} \min\{\alpha, (d-i)\beta\}. \qquad (2)$$

It is desirable to minimize both α as well as β since minimizing a results in a minimum storage solution while minimizing β (for fixed d) results in a storage solution that minimizes repair bandwidth. It can be deduced from (2) that it is not possible to minimize both α and β simultaneously and there is in fact a tradeoff between choices of the parameters α and β. The two extreme points in this tradeoff are termed the minimum storage regeneration (MSR) and minimum bandwidth regeneration (MBR) points respectively. The parameters α and β for the MSR point on the tradeoff can be obtained by first minimizing α and then minimizing β to obtain $$\alpha = \frac{B}{k}, \qquad (3)$$
$$\beta = \frac{B}{k(d-k+1)}.$$

Reversing the order, leads to the MBR point which thus corresponds to $$\beta = \frac{2B}{k(2d-k+1)}, \qquad (4)$$
$$\alpha = \frac{2dB}{k(2d-k+1)}.$$

We define an optimal [n, k, d] regenerating code as a code with parameters (α, β, B) satisfying the twin requirements that 1) the parameter set ($\alpha$, $\beta$, B) achieves the cut-set bound with equality and
2) decreasing either $\alpha$ or $\beta$ will result in a new parameter set that violates the cut set bound.

An MSR code is then defined as an [n, k, d] regenerating code whose parameters ($\alpha$, $\beta$, B) satisfy (3) and similarly, an MBR code as one with parameters ($\alpha$, $\beta$, B) satisfying (4). Clearly, both MSR and MBR codes are optimal regenerating codes.

The nature of the cut-set bound permits a divide-and-conquer approach to be used in the application of optimal regenerating codes to large file sizes, thereby simplifying system implementation Given an optimal [n, k, d] regenerating code with parameter set ($\alpha$, $\beta$, B), a second optimal regenerating code with parameter set ($\alpha'=\delta\alpha$, $\beta'=\delta\beta$, $B'=\delta B$) for any positive integer $\delta$ can be constructed, by dividing the $\delta$ B message symbols into $\delta$ groups of B symbols each, and applying the ($\alpha$, $\beta$, B) code to each group independently. Secondly, a common feature of both MSR and MBR regenerating codes is that in either case, their parameter set ($\alpha$, $\beta$, B) is such that both $\alpha$ and B are multiples of $\beta$. It follows that if one can construct an (optimal) [n, k, d] MSR or MBR code with $\beta=1$, then one can construct an (optimal) [n, k, d] MSR or MBR code for any larger value of $\beta$.

The problem of minimizing repair bandwidth for functional repair of a failed storage node is considered, where the evolution of the storage network through a sequence of failures and regenerations is represented as a network, with all possible data collectors represented as sinks. The data-reconstruction requirement is formulated as a multicast network coding problem, with the network having an infinite number of nodes. The cut-set analysis of this network leads to the relation between the parameters of a regenerating code given in equation (2). It can be seen that there is a tradeoff between the choice of the parameters $\alpha$ and $\beta$ for a fixed B and this is termed as the storage pair bandwidth tradeoff. This tradeoff is achievable under functional-regeneration. However, the coding schemes suggested are not explicit and require large field size.

A code structure that guarantees exact-regeneration of just the systematic nodes is provided for the MSR point with parameters [n=d+1, k, d>=2k−1]. This code makes use of interference alignment, and is termed as the 'MISER' code. Subsequently, it was shown that for this set of parameters and the code introduced for exact-regeneration of only the systematic nodes can also be used to repair the non-systematic (parity) node failures exactly provided repair construction schemes are appropriately designed. Such an explicit repair scheme is indeed designed, which contains an exact-regenerating MSR code for parameter set [n=5, k=3, d=4]. A proof of non-achievability of the cut-set bound on exact-regeneration at the MSR point, for the parameters [n, k, d<2k−3] when $\beta=1$. On the other hand, the MSR point is shown to be achievable in the limiting case of B approaching infinity (i.e., $\beta$ approaching infinity).

SUMMARY

The shortcomings of the prior art are overcome and additional advantages are provided through the provision of a method and system as described in the description.

In one embodiment, the disclosure provides a distributed data storage network. The network comprises of a plurality of storage nodes. An encoder is configured to obtain and assign pre-determined amount of data to be stored in each storage node in the network. An end user comprising of data reconstruction block configured to obtain source data by connecting to one of a plurality of subsets of the storage nodes. Also, when a storage node fails, it is replaced by a new node and consisting of a repair block for retrieving the data stored data stored in the failed node by connecting to one of a plurality of subsets of storage nodes. Further, each storage node consists of a data assisting block to compute and transmit data to assist in the repair of failed nodes.

In another embodiment, the disclosure provides a method of obtaining a distributed storage network. The method comprises of performing coding operation on source data of size B for obtaining a set of coded data, assigning each node with a predefined amount of coded data ($\alpha$), performing data reconstruction operation at the data reconstruction block at an end user by connecting to a predetermined number of storage nodes (k), performing repair operation at repair block of the new node replacing a failed storage node by retrieving data stored in the failed node by downloading predefined amount of coded data ($\beta$) from a predetermined number of storage nodes (d); and assisting in the repair of failed node by performing a computation by the repair assisting block of d storage nodes chosen by said new node and transmitting the result of the computation to said new node.

BRIEF DESCRIPTION OF THE ACCOMPANYING FIGURES

The novel features and characteristics of the disclosure are set forth in the appended claims. The embodiments of the disclosure itself, however, as well as a preferred mode of use, further objectives and advantages thereof, will best be understood by reference to the following detailed description of an illustrative embodiment when read in conjunction with the accompanying figures. One or more embodiments are now described, by way of example only, with reference to the accompanying figures in which:

The figures depict embodiments of the disclosure for purposes of illustration only. One skilled in the art will readily recognize from the following description that alternative embodiments of the structures and methods illustrated herein may be employed without departing from the principles of the disclosure described herein.

DETAILED DESCRIPTION

The foregoing has broadly outlined the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of Figures is provided for the purpose of illustration and description only and is not intended as a definition of the limits of the present disclosure.

Figure 1:
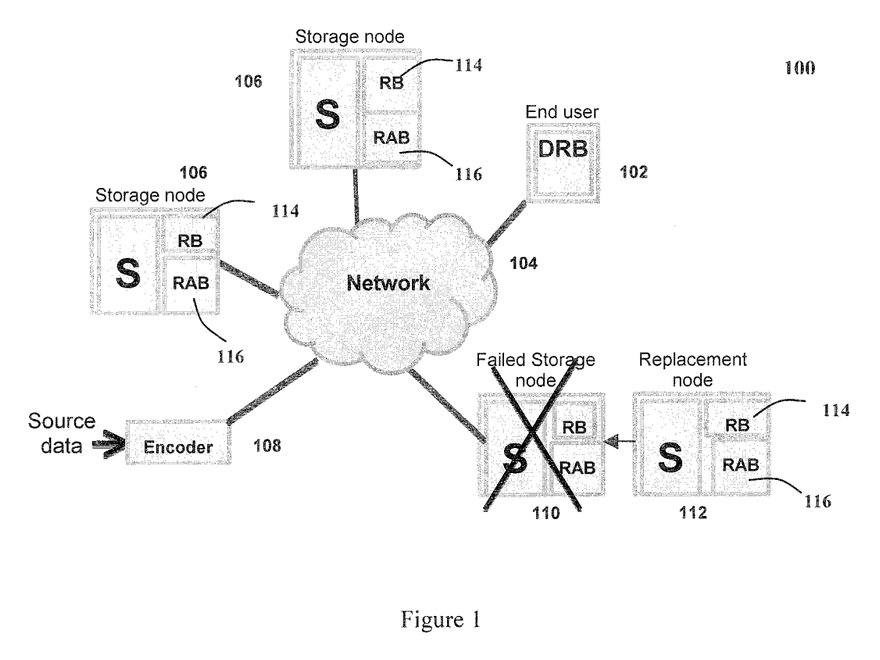
FIG. 1 illustrates one embodiment of a distributed storage network with storage nodes.
Figure 2:
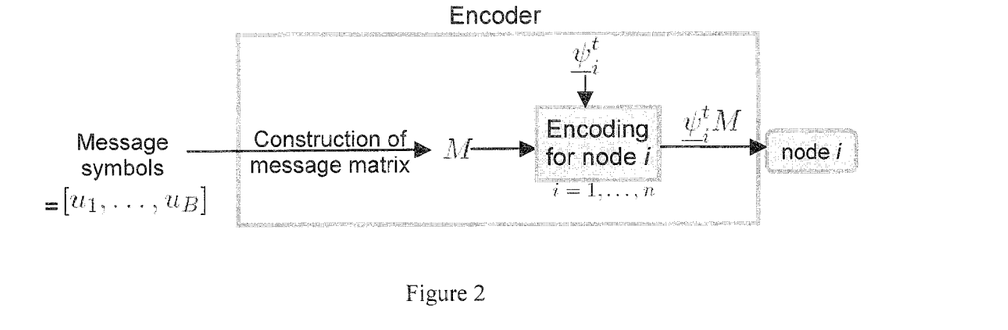
FIG. 2 illustrates the block diagram of the Encoder.

An exemplary embodiment of the present disclosure is a system 100 to enable data to be stored in a distributed manner comprising of a set of n storage nodes 106, each having a capacity of $\alpha$ symbols, connected through a network and storing symbols coded from a set of B source symbols. FIG. 1 is an illustration of the distributed storage system. An encoder 108 is illustrated as block diagram representation in the FIG. 2 which computes the coded symbols to be stored in the storage nodes. End-users 102, also called data collectors, having connectivity to a k-sized subset of the storage nodes configured to decode the stored coded-symbols in order to recover the data. A replacement 112 for failed node 110, using a regenerating decoder (repair block 114), being able to recover the data that was stored in the failed node by downloading $\beta$ symbols each from a d-sized subset of the existing storage nodes.

The encoder 108 is configured to encode the source data, and assign pre-determined amount of data to be stored in each storage node 106 in the network 104. An end user 102 comprising of a processing unit configured to obtain source data by connecting to one of a plurality of subsets of the storage nodes S 106. Also, each storage node 106 consists of a repair block 114 (RB) or a means for replacing any failed storage node to repair a storage node 110 with a new storage node 112 and retrieving the data stored in said failed node by connecting to one of a plurality of subsets of storage nodes. The storage node 106, 112 also consists of a repair assisting block 116 (RAB) or means for computing and transmitting data to assist in the repair of failed nodes. The repair assisting block 116 (RAB) is shown in FIG. 4B.

Figure 3A:
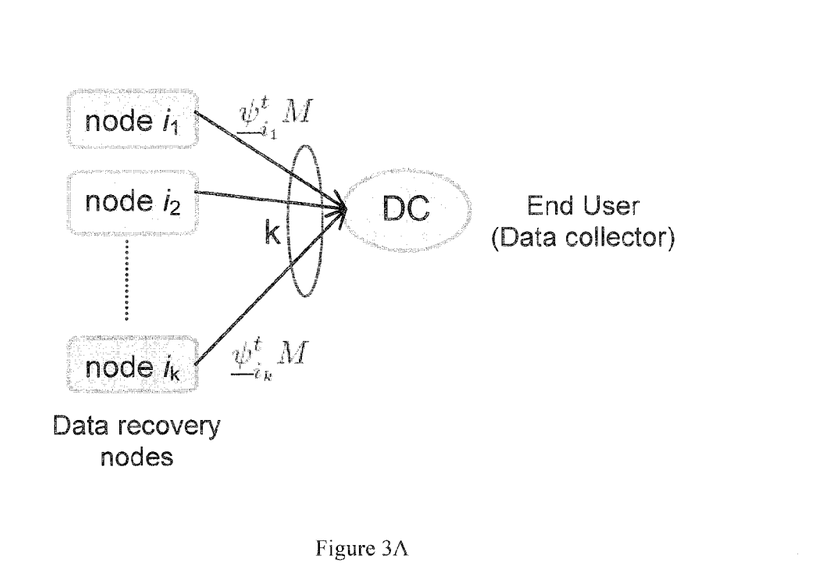
FIG. 3A illustrates data recovery by an end user (data collector) by connecting to any k nodes.
Figure 3B:
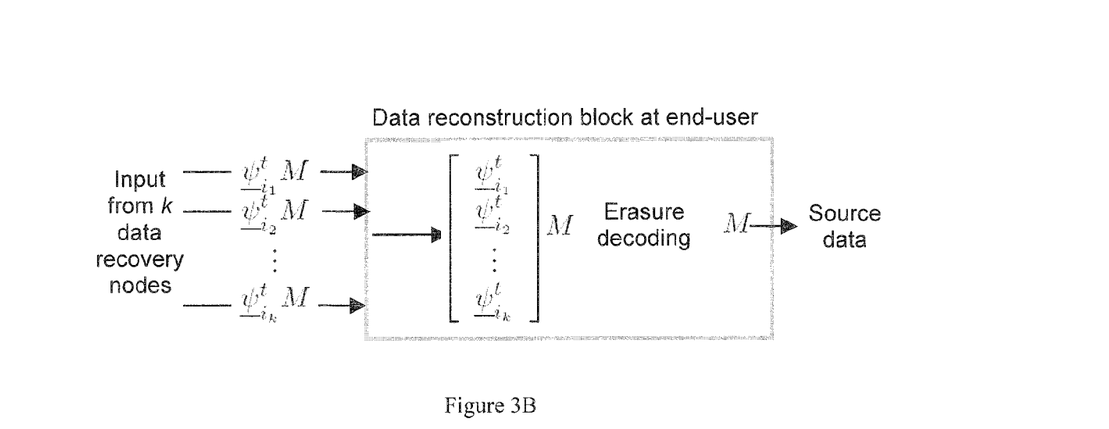
FIG. 3B illustrates a block diagram of the data reconstruction block at the end-users.
Figure 4A:
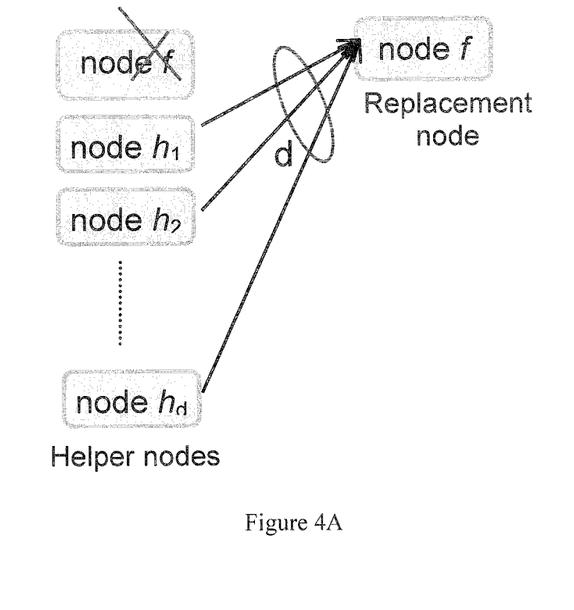
FIG. 4A illustrates repair of a failed node, node f, with the replacement node f downloading data from any d remaining nodes.
Figure 4B:
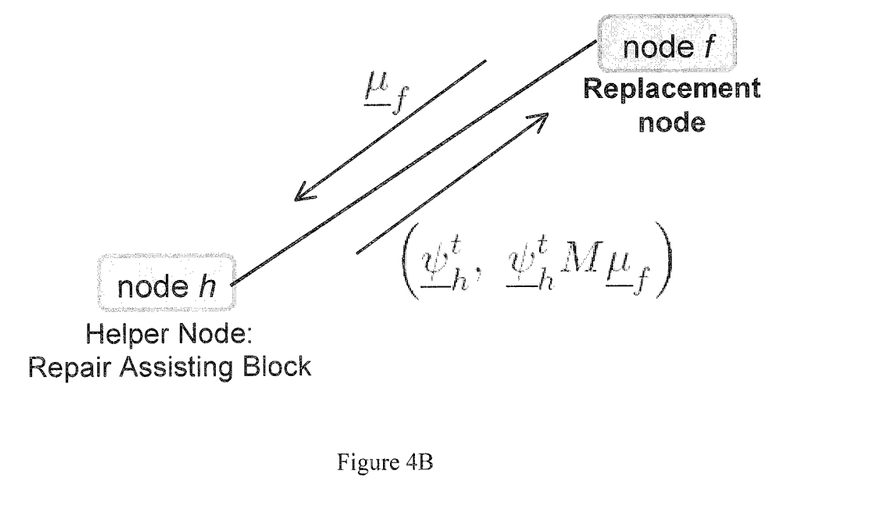
FIG. 4B illustrates the interaction between the replacement node f and repair assisting block of the helper node.
Figure 4C:
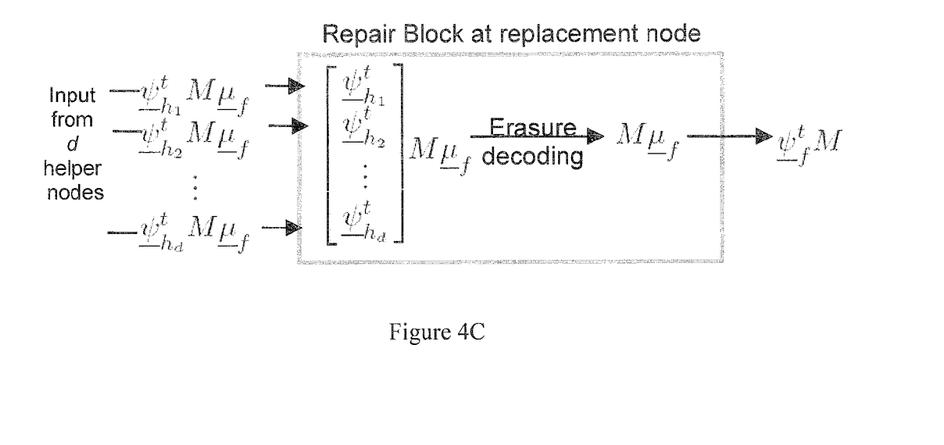
FIG. 4C illustrates repair block at replacement node, as one embodiment.

FIGS. 3A and 3B illustrate the data recovery at the end user (data collector), and FIGS. 4A, 48 and 4C illustrate repair of a failed node. The process of a data collector recovering the source data is called reconstruction, and the process of replacement node obtaining the data that was stored in the failed node is called repair or regeneration. The amount of data download that the replacement node needs to perform is termed as the repair bandwidth, d$\beta$.

Data Distribution is used to distribute data, which is generated at a point source, across a network to enable reconstruction of data in a distributed manner. A storage node that contains the appropriate encoded data is referred as a filled node, and storage nodes that do not contain any data as the empty nodes.

Initially, all the storage nodes are assumed to be empty. First, the data source encodes the data to be stored in its neighbouring empty nodes, and transmits this data to them. Subsequently, the nodes in the neighbourhood of filled nodes download data from them using the regeneration algorithm. This process goes on till all the nodes are filled.

The total amount of data transfer in this process is the minimum possible, and equal to the amount of data transfer required if a central node would have transmitted appropriate encoded data to all the storage nodes. However, the distributed nature of the data distribution has several advantages. Load balancing is achieved, and the traffic is uniform across the network. The source node can become unavailable after the initial transmission of coded data to the storage nodes in its neighbourhood. Though the total amount of data transfer is equal, or nearly equal, in both cases, the number of hops across the network that any data packet will have to travel in the case of these codes will be considerably lesser, thereby reducing the network congestion.

The data stored in the $i^{th}$ storage node in the system is completely determined a single encoding vector, as compared to a large generator matrix in general. The encoding vector suffices for encoding, reconstruction, and regeneration. The short length of the encoding vector reduces the overhead associated with the need for nodes to communicate their encoding vectors to the DC during reconstruction, and to the replacement node during regeneration of a failed node.

The disclosure provides three variations of such distributed storage systems, as described subsequently. The choice of the system to be used will depend on the trade-off between the costs of storage space, network bandwidth utilization and connectivity in the network. The first variation works on the network bandwidth utilization and repairs a failed node using the minimum possible repair bandwidth. Also, this variation minimizes the storage space. The second variation is suited when there is a higher price for storage space. It first minimizes the amount of data needed to be stored in each node, and then reduces the repair bandwidth to the minimum possible for this amount of storage. These two systems enable a data collector to recover the entire source data by downloading data from any k nodes, and also permit node repair by connecting to any d nodes. The first and second variations are called as common product-matrix framework. The third variation simultaneously achieves both the absolute minimum storage, as well as absolute minimum repair bandwidth. The third variation is called as Twin-code framework.

All three variations fall under a common framework, in which the storage nodes store coded data or symbols that is expressed by the matrix product expression $\Psi$ M. Each codeword in the distributed storage code can be represented by an (n$\times\alpha$) code matrix C whose $i^{th}$ row $c^t_i$, contains $\alpha$ symbols stored by the $i^{th}$ node. Each code matrix is a product $$C = \Psi M \quad (1)$$

of an (n$\times$d) encoding matrix $\Psi$ and an (d$\times\alpha$) message matrix M. The entries of the matrix $\psi$ are fixed a priori and are independent of the message symbols. The message matrix M contains the B message symbols, with some symbols possibly repeated. The $i^{th}$ row $\psi^t_i$ of $\Psi$ are referred as the encoding vector of node i as it is this vector that is used to encode the message into the form in which it is stored within the $i^{th}$ node:

$$c^t_i = \psi^t_i M, \quad (2)$$

where the superscript 't' is used to denote the transpose of a matrix. The choice of T and M depends on the variation under consideration. Each node is associated with a vector (a row of $\Psi$), and the encoder multiplies that vector with M to obtain the symbols stored in the node. The source symbols or data are from a finite field $F_q$, and any stored symbol is a linear combination of these symbols over $F_q$. The size of the finite field required is of the order of n, and no further restrictions are imposed on the field size.

The entire data is divided into stripes of sizes corresponding to $\beta=1$. Since each stripe is of minimal size, the complexity of encoding, reconstruction and regeneration operations are considerably lowered, and so are the buffer sizes required at data collectors and replacement nodes. Furthermore, the operations that need to be performed on each stripe are identical and independent, and hence can be performed in parallel efficiently by a GPU/FPGA/multi-core processor.

The end-users download the data stored in a subset of k nodes, and also download a digest (i.e., a possibly condensed form) of their node vectors, and a decoder at the end-user can recover the source data from this information.

A replacement node consists of a decoder that first assimilates the downloaded data, and subsequently decodes this coded data to recover the data that was stored in the failed node.

Each storage node can also assist in the repair of any failed node. On being contacted by the node replacing a failed node, a storage node computes certain linear combinations of the symbols stored in it, this linear combination being dependent on the encoding vector of the failed node, and passes on the result.

The following are the steps performed in reconstruction and regeneration for the three variations of the distributed storage system.

In one embodiment, the first variation is one of the product-matrix framework which has a data collector can recover the entire source by downloading data from any k storage nodes, and a failed node can be regenerated by any d existing nodes. The common structure of the code matrices leads to common architectures for both data-reconstruction and exact-regeneration.

Data-reconstruction amounts to recovering the message matrix M from the $k\alpha$ symbols obtained from an arbitrary set of k storage nodes. Let the set of k nodes to which the data collector connects be denoted as $\{i_1, \ldots, i_k\}$. The $i_{th}$ node in the set passes on the message vector $\Psi^t_j M$ to the data collector. The data collector thus obtains the product matrix $$\Psi_{DC} M,$$

where $\psi_{DC}$ is the sub matrix of consisting of the k rows $\{i_1, \ldots, i_k\}$. It then uses the properties of the matrices and M to recover the message. The precise procedure for recovering M is a function of the particular construction. Each node in the network is associated to a distinct (d×1) encoding vector $\psi_i$. In the regeneration process, a related vector $\mu_i$ of length $\alpha$ is used, that contains a subset of the components of $\psi_i$.

The replacement of a failed node is illustrated in FIGS. 4A, 4B and 4C. To regenerate a failed node f, the node replacing the failed node connects to an arbitrary subset $\{h_1, \ldots, h_d\}$ of d storage nodes which we will refer to as the d helper nodes which is shown in FIG. 4A. Each helper node passes on the inner product of $\alpha$ symbols stored in it with $\mu_f$ to the replacement node as shown in FIG. 4B, the helper node $h_j$ passes $$\Psi^t_{h_j} M \mu_f$$

The replacement node thus obtains the product matrix which is shown in FIG. 4C, i.e.

$$\Psi_{repair} M \mu_f$$

where $\psi_{repair}$ is the submatrix of $\psi$ consisting of the d rows $\{h_1, \ldots, h_d\}$. From this it turns out, as will be shown subsequently, that one can recover the desired symbols. Here again, the precise procedure is dependent on the particular construction. An important feature of the product-matrix construction is that each of the nodes $h_j$ participating in the regeneration of node f, needs only has knowledge of the encoding vector of the failed node f and not the identity of the other nodes participating in the regeneration. This significantly simplifies the operation of the system.

In one embodiment the product-matrix MBR code construction is described. The specific make-up of the encoding matrix $\psi$ and the message matrix M that results in an [n, k, d] MBR code with $\beta=1$. A notable feature of the construction is that it is applicable to all feasible values of [n, k, d], i.e., all n, k, d satisfying $k \leq d \leq n-1$. Since the code is required to be an MBR code with $\beta=1$, it must possess the data-reconstruction and exact-regeneration properties required of a regenerating code, and in addition, have parameters $\{\alpha, B\}$ that satisfy the equations for the MBR point. In particular, the expression for the file size B at the MBR point can be rewritten in the form:

$$B = \binom{k+1}{2} + k(d-k)$$

Thus the parameter set of the desired [n, k, d] MBR code is ($\alpha=d$, $\beta=1$, $B=((k+1)/2+k(d-k))$.

Let S be a (k×k) matrix constructed so that the k(k+1)/2 entries in the upper-triangular half of the matrix are filled up by k(k+1)/2 distinct message symbols drawn from the set $\{u_i\}_{i=1}^B$. The k(k−1)/2 entries in the strictly lower-triangular portion of the matrix are then chosen so as to make the matrix S a symmetric matrix. The remaining k (d−k) message symbols are used to fill up a second (k×(d−k)) matrix T. The message matrix M is then defined as the (d×d) symmetric matrix given by $$M = \begin{bmatrix} S & T \\ T^t & 0 \end{bmatrix} \quad (3)$$

The symmetry of the matrix will be exploited when enabling node repair. Next, define the encoding matrix to be any (n×d) matrix of the form $$\Psi = [\Phi \Delta],$$

where $\Phi$ and $\Delta$ are (n×k) and (n×(d−k)) matrices respectively, chosen in such a way that 1) any d rows of $\Psi$ are linearly independent,
2) any k rows of $\Phi$ are linearly independent.

MBR Exact-Regeneration of any failed node can be achieved by connecting to any d of the (n−1) remaining nodes.

Let $\psi^t_f$ be the row of $\Psi$ corresponding to the failed node f. The d symbols stored in the failed node correspond to the vector $$\psi^t_f M \quad (4)$$

The replacement for the failed node f connects to an arbitrary set $\{h_j | j=1, \ldots, d\}$ of d helper nodes. Upon being contacted by the replacement node, the helper node $h_j$ computes the inner product $$\psi^t_{h_j} M \psi_f$$

and passes on this value to the replacement node. Thus, in the present construction, the vector $\mu_f$ equals $\psi_f$ itself. The replacement node thus obtains the d symbols $\Psi_{repair} M \psi_f$ from the d helper nodes, where $$\Psi_{repair} = \begin{bmatrix} \psi_{h_1}^t \\ \psi_{h_2}^t \\ \vdots \\ \psi_{h_d}^t \end{bmatrix}$$

By construction, the (d×d) matrix $\Psi_{repair}$ is invertible. Thus, the replacement node recovers $M\psi_f$ through multiplication on the left by $\Psi^{-1}_{repair}$. Since M is symmetric, $$(M\psi_f)^t = \psi_f^t M, \quad (5)$$

and this is precisely the data previously stored in the failed node.

In MBR Data-Reconstruction, all the B message symbols can be recovered by connecting to any k nodes, i.e., the message symbols can be recovered through linear operations on the entries of any k rows of the matrix C.

Let $$\Psi_{DC} = [\Phi_{DC} \Delta_{DC}] \quad (6)$$

be the (k×d) sub-matrix of $\Psi$, corresponding to the k rows of to which the data collector connects. Thus the data collector has access to the symbols $$\Psi_{DC} M = [\Phi_{DC} S + \Delta_{DC} T^t \Phi_{DC} T]. \quad (7)$$

By construction, $\Phi_{DC}$ is a non-singular matrix. Hence, by multiplying the matrix $\Psi_{DC} M$ on the left by $\Phi_{DC}^{-1}$, one can recover first T and subsequently, S.

Any exact-regenerating code can be made systematic through a non-singular transformation of the message symbols. In the present case, there is a simpler approach, in which the matrix $\Psi$ can be chosen in such a way that the code is automatically systematic. We simply make the choice:

$$\Psi = \begin{bmatrix} I_k & 0 \\ \tilde{\Phi} & \tilde{\Delta} \end{bmatrix}, \quad (8)$$

where $I_k$ is the (k×k) identity matrix, 0 is a (k×(d−k)) zero matrix, $\tilde{\Phi}$ and $\tilde{\Delta}$| are matrices of sizes ((n−k)×k) and ((n−k)×(d−k)) respectively, such that [$\tilde{\Phi}$ $\tilde{\Delta}$|] is a Cauchy matrix. Clearly the code is systematic. It can be verified that the matrix has the properties listed in MBR Exact-Regeneration.

A node replacing the failed node needs to download the absolute minimum amount of data, i.e., downloads only what it stores: $d\beta = \alpha$. Further, the storage space required at each node a has the minimum possible value for this setting, equal to $$\alpha = \frac{2dB}{k(2d - k + 1)}.$$

As in the framework, the coded-symbols stored in the storage nodes can be expressed by the matrix product expression $[\Phi\Delta]M$, wherein any k rows of $\Phi$ and any d rows of $\Psi$ are linearly independent.

In one embodiment variation 2 which is called MSR is described. As in variation 1, a data collector can recover the entire source by downloading data from any k storage nodes, and a failed node can be regenerated by any d existing nodes.

Each storage node stores the absolute minimum amount of data, i.e., 1/k of the total source data. For this setting, we enable any failed node to be repaired, when d>=2k−2, with β having minimum possible value.

In another embodiment the product-matrix MSR code construction is explained, identify the specific make-up of the encoding matrix and the message matrix M that results in an [n, k, d] MSR code with β=1. The construction applies to all parameters [n, k, d≥2k−2]. Since the code is required to be an MSR code with β=1, it must possess the data-reconstruction and exact-regeneration properties required of a regenerating code, and in addition, the parameters {α, B} satisfy equation the conditions for the MSR point. We first construct MSR codes for the case when d=2k−2 and subsequently extend it to the case when d>−2k−2.

The construction an MSR code in the product-matrix format for d=2k−2 is as follows:

At the MSR point with d=2k−2 we have $$\alpha = d - k + 1 = k - 1, \quad (9)$$

and hence $$d = 2\alpha. \quad (10)$$

Also, $$B = k\alpha = \alpha(\alpha + 1) \quad (11)$$

The (d×α) message matrix M is $$M = \begin{bmatrix} S_1 \\ S_2 \end{bmatrix}, \quad (12)$$

where $S_1$ and $S_2$ are (α×α) symmetric matrices constructed such that the α(α+1)/2 entries in the upper-triangular part of each of the two matrices are filled up by α(α+1)/2 distinct message symbols. Thus, all the B=α(α+1) message symbols are contained in the two matrices $S_1$ and $S_2$. The entries in the strictly lower-triangular portion of the two matrices $S_1$ and $S_2$ are chosen so as to make the matrices $S_1$ and $S_2$ symmetric. The encoding matrix is an (n×d) matrix given by $$\Psi = [\Phi \Lambda \Phi], | \quad (13)$$

where $\Phi$ is an (n×α) matrix and Λ is an (n×n) diagonal matrix. The elements of are chosen such that the following conditions are satisfied:
1) any d rows of $\Psi$ are linearly independent,
2) any a rows of $\Phi$ are linearly independent and
3) the n diagonal elements of Λ are distinct.

The above requirements are met by choosing $\Psi$ to be a Vandermonde matrix with elements chosen carefully to satisfy the third condition. Then under our code-construction framework, the row of the (n×α) product matrix C=$\Psi$M, contains a code symbols stored by the $i^{th}$ node.

In one embodiment, MSR Exact-Regeneration of any failed node can be achieved by connecting to any d=2k−2 of the remaining (n−1) nodes.

Let [$\phi_f^t \lambda_f \phi_f^t$] be the row of corresponding to the failed node. Thus the α symbols stored in the failed node were $$[\phi_f^t \lambda_f \phi_f^t] M = \phi_f^t S_1 + \lambda_f \phi_f^t S_2| \quad (14)$$

The replacement for the failed node f connects to an arbitrary set {$h_j | j=1, \ldots, d$} of d helper nodes. Upon being contacted by the replacement node, the helper node $h_j$ computes the inner product $\psi_{h_j}^t M \phi_f$ and passes on this value to the replacement node. Thus, in the present construction, the vector $\underline{\mu}_f$ equals $\underline{\square}_f$. The replacement node thus obtains the d symbols $\Psi_{repair}M\underline{\square}_f$ from the d helper nodes, where $$\Psi_{repair} = \begin{bmatrix} \underline{\psi}^t_{h_1} \\ \underline{\psi}^t_{h_2} \\ \vdots \\ \underline{\psi}^t_{h_d} \end{bmatrix}$$

By construction, the (d×d) matrix $\Psi_{repair}$ is invertible. Thus the replacement node now has access to $$M\underline{\phi}_f = \begin{bmatrix} S_1\underline{\phi}_f \\ S_2\underline{\phi}_f \end{bmatrix}$$

As S1 and S2 are symmetric matrices, the replacement node has thus acquired through transposition, both $\phi^t_f S_1|$ and $\phi^t_f S_2|$. Using this it can obtain $$\phi^t_f S_1 + \lambda_f \phi^t_f S_2 \tag{15}$$

which is precisely the data previously stored in the failed node.

In one embodiment of the MSR Data-Reconstruction, all the B message symbols can be recovered by connecting to any k nodes, i.e., the message symbols can be recovered through linear operations on the entries of any k rows of the code matrix C.

Let $$\Psi_{DC} = [\Phi_{DC} \Lambda_{DC} \Phi_{DC}] \tag{16}$$

be the (k×d) submatrix of, containing the k rows of which correspond to the k nodes to which the data collector connects. Hence the data collector obtains the symbols $$\Psi_{DC}M = [\Phi_{DC} \quad \Lambda_{DC}\Phi_{DC}] \begin{bmatrix} S_1 \\ S_2 \end{bmatrix} \tag{17}$$
$$= [\Phi_{DC}S_1 + \Lambda_{DC}\Phi_{DC}S_2]$$

The data collector can post-multiply this term with $\Phi_{DC}$ to obtain $$[\Phi_{DC}S_1 + \Lambda_{DC}\Phi_{DC}S_2]\Phi^T_{DC} = \Phi_{DC}S_1\Phi^T_{DC} + \Lambda_{DC}\Phi_{DC}S_2\Phi^T_{DC}| \tag{18}$$

Next, let the matrices P and Q be defined as $$P = \Phi_{DC}S_1\Phi_{DC}^T,$$
$$Q = \Phi_{DC}S_2\Phi_{DC}^T. \tag{19}$$

As $S_1$ and $S_2$ are symmetric, the same is true of the matrices P and Q. In terms of P and Q, the data collector has access to the symbols of the matrix $$P + \Lambda_{DC}Q \tag{20}$$

The $(i,j)^{th}$, $1 \le i, j \le k$, element of this matrix is $$P_{ij} + \lambda_i Q_{ij}, \tag{21}$$

while the $(j, i)^{th}$ element is given by $$P_{ji} + \lambda_j Q_{ji} = P_{ij} + \lambda_j Q_{ij}|, \tag{22}$$

where equation (22) follows from the symmetry of P and Q. By construction, all the $\lambda_i$ are distinct and hence using (21) and (22), the data collector can solve for the values of $P_{ij}$, $Q_{ij}$ for all $i \ne j$.

Consider first the matrix P. Let $\Phi_{DC}$ be given by $$\Phi_{DC} = \begin{bmatrix} \underline{\phi}^t_1 \\ \vdots \\ \underline{\phi}^t_{\alpha+1} \end{bmatrix} \tag{23}$$

All the non-diagonal elements of P are known. The elements in the $i^{th}$ row (excluding the diagonal element) are given by $$\phi^t_i S_1[\phi_1 \ldots \phi_{i-1}\phi_{i+1} \ldots \phi_{\alpha+1}]. \tag{24}$$

However, the matrix to the right is non-singular by construction and hence the data collector can obtain $$\{\phi^t_i S_1 | 1 \le i \le \alpha+1\}|. \tag{25}$$

Selecting the first α of these, the data collector has access to $$\begin{bmatrix} \underline{\phi}^t_1 \\ \vdots \\ \underline{\phi}^t_\alpha \end{bmatrix} S_1 . \tag{26}$$

The matrix on the left is also non-singular by construction and hence the data collector can recover $S_1$. Similarly, using the values of the non-diagonal elements of Q, the data collector can recover $S_2$.

In one embodiment, as stated in code construction framework, that every exact-regenerating code has a systematic version and further, that the code could be made systematic through a process of message-symbol remapping. The following makes this more explicit in the context of the product-matrix MSR code.

Let $\Psi_k$ be the (k×d) submatrix of $\Psi$, containing the k rows of $\Psi$ corresponding to the k nodes which are chosen to be made systematic. The set of kα symbols stored in these k nodes are given by the elements of the (k×α) matrix $\Psi_k M$. Let U be a (k×α) matrix containing the B=kα source symbols. Mapping $$\Psi_k M = U, \tag{26}$$

and solve for the entries of M in terms of the symbols in U. This is precisely the data-reconstruction process that takes place when a data collector connects to the k chosen nodes. Thus, the value of the entries in M can be obtained by following the procedure outlined in MSR Data-Reconstruction. Then, use this M to obtain the code C=ΨM. Clearly, in this representation, the k chosen nodes store the source symbols U in uncoded form.

In one embodiment, an explicit MSR Product-Matrix Codes for d≥2k−2 is described. An MSR code for d=2k−2 can be used to obtain MSR codes for all d≥2k−2.

An explicit [n'=n+1, k'=k+1, d'=d+1] exact-regenerating code C' that achieves the cut-set bound at the MSR point can be used to construct an explicit [n, k, d] exact-regenerating code C that also achieves the cut-set bound at the MSR point. Furthermore if d'=ak'+b in code C', d=ak+b+(a−1) in code C. If C' is linear, so is C.

If both codes operate at the MSR point, then the number of message symbols B', B in the two cases must satisfy $B'=k'(d'-k'+1)$ and $B=k(d-k+1)$ respectively, so that $B'-B=d-k+1=\alpha$.

First construct an MSR-point-optimal [n', d'] exact-regenerating code C in systematic form with the first k' rows containing the B' message symbols. Let C'' be the subcode of C' consisting of all code matrices in C' whose top row is the all-zero row (i.e., the first $\alpha$ of the B' message symbols are all zero). Clearly, the subcode C'' is of size $q^{B'-\alpha}=q^B$. Note that C'' also possesses the same exact-regeneration and data-reconstruction properties as does the parent code C'.

Let the code C now be formed from subcode C'' by puncturing (i.e., deleting) the first row in each code matrix of C''. Clearly, code C is also of size $q^B$. We claim that C is an [n, k, d] exact-regenerating code. The data-reconstruction requirement requires that the B underlying message symbols be recoverable from the contents of any k rows of a code matrix C in C. But this follows since, by augmenting the matrices of code C by placing at the top an additional all-zero row, to obtain a code matrix in C'' and code C'' has the property that the data can be recovered from any (k+1) rows of each code matrix in C''. A similar argument shows that code C also possesses the exact-regeneration property. Clearly if C' is linear, so is code C. Finally, $d'=\alpha k'+b$ $\Rightarrow d+1=\alpha(k+1)+b$ $\Rightarrow d=\alpha k+b+(\alpha-1)$ Codes for the case d>=2k−2 can now be obtained simply by iterating the above procedure multiple times.

In one embodiment of the twin-code framework, the n storage nodes in the distributed network are partitioned arbitrarily into two types, labelled as Type 0 and Type 1 nodes. The number of nodes of Type 0 is denoted by $n_0$, and the number of nodes of Type 1 is denoted by $n_1$. To arrive at the data stored in nodes of Type 0, the message is encoded using an arbitrary linear block code $C_0$. To arrive at the data stored in Type 1 nodes, the message symbols are first permuted by means of simple transposition and then encoded by a second arbitrary linear block code $C_1$. The two codes do not necessarily have to be distinct. Repair of a failed node of one type is accomplished by downloading data from a subset of nodes of the other type. Further, a data-collector can recover the entire message by connecting to a subset of the nodes of the same type The message to be stored across the network comprises of B symbols drawn from the finite field $F_q$. For i=0, 1, let $C_i$ be an arbitrary [$n_i$, k] code over $F_q$ having (k×$n_i$) generator matrix $G_i$. Let $g_{(i,l)}(1 \leq l \leq n_i)$ denote the $l^{th}$ column of $G_i$.

In one embodiment of the twin-code framework is encoding. The message is first divided into fragments comprising of $k^2$ symbols. The code for a single fragment and constructions for the case when the size of the message is larger can be obtained by concatenating multiple such fragments. Thus, we have $B=k^2$ (27)

Let the $k^2$ symbols be arranged in the form of a (k×k) matrix $M_0$, which we will call the message matrix. Let $$M_1 \triangleq M_0^t,$$ (28)

where the superscript 't' denotes the transpose. For i=0, 1, the data stored in the nodes of Type i is obtained using code $C_i$ and message matrix $M_i$ as follows. Each node of Type i stores the k symbols corresponding to a column of the (k×$n_i$) matrix $M_i G_i$. More specifically, node l ($1 \leq l \leq n_i$) stores the symbols in its $l^{th}$ column, given by $$M_i g_{(i,l)}$$ (29)

$g_{(i,l)}$ is encoding vector of this node. Thus, under our encoding algorithm, every node stores k symbols.

In one embodiment, the processes of data-reconstruction and node-repair is described under the Twin-code framework, the process of node-repair is reduced to one of erasure decoding of the constituent codes. This is described in detail in the subsequent subsections. Here, we define the term feasible set of nodes which will aid in the description.

A feasible set of nodes is a set of nodes of the same type, say Type i, i in {0, 1}, such that the components of the codeword of the Code $C_i$ stored in these nodes permit erasure decoding of Code $C_i$. For example, in the case when Code $C_o$ is MDS, any set of k nodes of Type 0 is a feasible set.

In one embodiment, the data-reconstruction and node-repair for the case when both $C_0$ and $C_1$ are MDS codes are described. MDS codes serve as a simple and concrete example, and MDS codes turn in a strong performance in that they simultaneously minimize the storage per node as well as the amount of download required to repair a failed node. The codes resulting from the Twin-code framework when the constituent codes are MDS are called as Twin-MDS (distributed storage) codes.

Minimizing Both Storage per Node and Repair-Bandwidth for the case when both $C_0$ and $C_1$ are MDS codes over Fq. Under the Twin-code framework, data-reconstruction can be accomplished by downloading the data stored in any feasible set of nodes of the same type. A failed node of one type can be repaired by downloading one symbol each from any feasible set of nodes of the other type. In the present case, the constituent codes $C_0$ and $C_1$ are MDS, and permit decoding from any k nodes. Thus, in this case, a data-collector can recover the entire file by connecting to any k nodes of the same type and downloading the $k^2$ symbols stored in them, and a replacement node of a certain type can recover the k symbols that were stored in the failed node by downloading a single symbol over $F_q$ from any subset of k nodes belonging to the other type.

For the data-reconstruction in the above case, let the data-collector connects to the first k nodes of Type 1. Thus, the data-collector gains access to the $k^2$ symbols:

$$M_1[g_{(1,1)} \cdots g_{(1,k)}]$$ (30)

The MDS property of code $C_1$ guarantees linear independence of the corresponding k columns of $G_1$, and hence the data-collector can recover the message matrix $M_1$ by inverting the matrix formed by these columns. Equivalently, the action of the data-collector can also be viewed as erasure decoding of code $C_1$ in the presence of ($n_1$−k) erasures. For this, consider the k symbols in the first row of the matrix in equation (30). Clearly, these are k components of the codeword of code $C_1$ corresponding to the k message symbols in the first row of $M_1$. Thus, each of the rows of message matrix $M_1$ can be decoded independently, allowing the data-collector to perform scalar decoding of the vector code.

For node-repair, let node f of Type 0 fails. Thus the replacement node needs to recover the k symbols $$M_0 g_{(0,f)} \quad (31)$$

Further, let the node connects to the first k nodes of Type 1. Under the Twin-code framework, the replacement node makes known its identity to each of the helper nodes. In turn, the $l^{th}$ helper node ($1 \le l \le k$)| passes the inner product of the k symbols $M_1 g_{(1,l)}$| stored in it with the encoding vector $g_{(0,f)}$ of the failed node: $g^t_{(0,f)} M_1 g_{(1,l)}$ Thus, the replacement node gains access to the k symbols $$g^t_{(0,f)} M_1 [g_{(1,l)} \cdots g_{(1,k)}] \quad (32)$$

Now, setting $$\underline{\mu}^t \stackrel{\Delta}{=} g^t_{(0,f)} M_1, \quad (33)$$

we see that the replacement node has access to $$\mu^t [g_{(1,l)} \cdots g_{(1,k)}] \quad (34)$$

It is clear that μt can be recovered by erasure decoding of the MDS code $C_1$ under ($n_1$−k) erasures. Recall that by construction, we have $M_0 = M^t_1$, and hence $$\mu = (g^t_{(0,f)} M_1)^t = M_0 g_{(0,f)} \quad (35)$$

Thus, the vector μ comprises of precisely the k symbols required by the replacement node. It follows that repair of a node of Type 0 is reduced to erasure decoding of code $C_1$.

The Twin-MDS codes are optimal in the following sense. Under the data-reconstruction condition that (a) the message be recoverable from one or more subsets of k nodes, (b) every node must belong to at least one such subset, and (c) each node store an equal amount of data, the storage space of B/k=k symbols required per node is clearly the minimum required. Furthermore, the download of k symbols from the network to recover the k symbols stored prior to failure, is also clearly the minimum possible. Thus, Twin-MDS codes simultaneously minimize the storage and the repair-bandwidth. Using twin code framework simultaneous minimization of the two resources is achieved.

Figure 5:
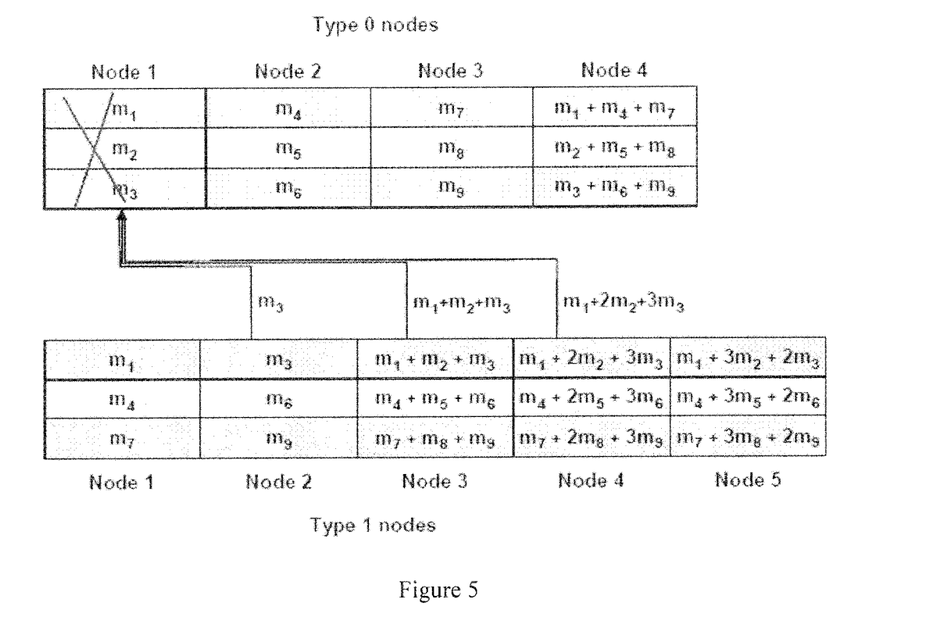
FIG. 5 illustrates an example of the twin code framework.

FIG. 5 illustrates a numerical example, where the network has n=9 nodes, with $n_0$=4, $n_1$=5, k=3, giving B=$k^2$=9. The code presented operates over the finite field $F_7$. The message matrices $M_0$ and $M_1$ (=$M^t_0$) populated by the message symbols $\{m_i\}^9_{i=1}$, and the generator matrices $G_0$ and $G_1$ are:

$$M_0 = \begin{bmatrix} m_1 & m_4 & m_7 \\ m_2 & m_5 & m_8 \\ m_3 & m_6 & m_9 \end{bmatrix}, G_0 = \begin{bmatrix} 1 & 0 & 0 & 1 \\ 0 & 1 & 0 & 1 \\ 0 & 0 & 1 & 1 \end{bmatrix}, G_1 = \begin{bmatrix} 1 & 0 & 1 & 1 & 1 \\ 0 & 0 & 1 & 2 & 3 \\ 0 & 1 & 1 & 3 & 2 \end{bmatrix}$$

It can be verified that this code permits a data-collector to reconstruct the entire message from any three nodes of the same type. The figure also explains the repair of node 1 of Type 0, which has an encoding vector $[1\ 0\ 0]^t$, with the help of nodes 2, 3 and 4 of Type 1.

In a Twin-code framework, a data-collector can recover the entire message by connecting to any feasible subset of nodes of the same type. To see how data-reconstruction is accomplished, let us suppose that the data-collector connects to a feasible subset of Type 1 nodes. Restricting our attention to nodes of Type 1 alone, the system is identical to a distributed storage system employing only code $C_1$. Thus, the data-collector can recover the entire message by applying the decoding procedure of code $C_1$, k times.

In one embodiment of the Twin-code framework, a replacement node of a certain type can recover the symbols stored in the failed node by downloading a single symbol from any feasible subset of the other type. The repair algorithm reduces the problem of node-repair to one of data-reconstruction, however with an amount of download which is close to a small fraction of the entire data. Let the failure of node f is of Type 0. The replacement node desires to recover the k symbols $$M_0 g_{(0,f)} |\ .$$

Under the Twin-code framework, the replacement node connects to a feasible set of Type 1 nodes and makes known its identity. In turn, each helper node passes back an inner product of the k symbols $M_1 g_{(1,l)}$ stored in it with the encoding vector $g_{(0,f)}$ of the failed node: helper node l passes the symbol $$g^t_{(0,f)} M_1 g_{(1,l)} | \quad (36)$$

As in the case of MDS codes, setting $$\underline{\mu}^t \stackrel{\Delta}{=} g^t_{(0,f)} M_1, \quad (37)$$

the replacement node has access to the symbols $$\{\mu^t g_{(1,l)} | \text{node } l \text{ in the particular feasible set}\}| \quad (38)$$

Figure 6:
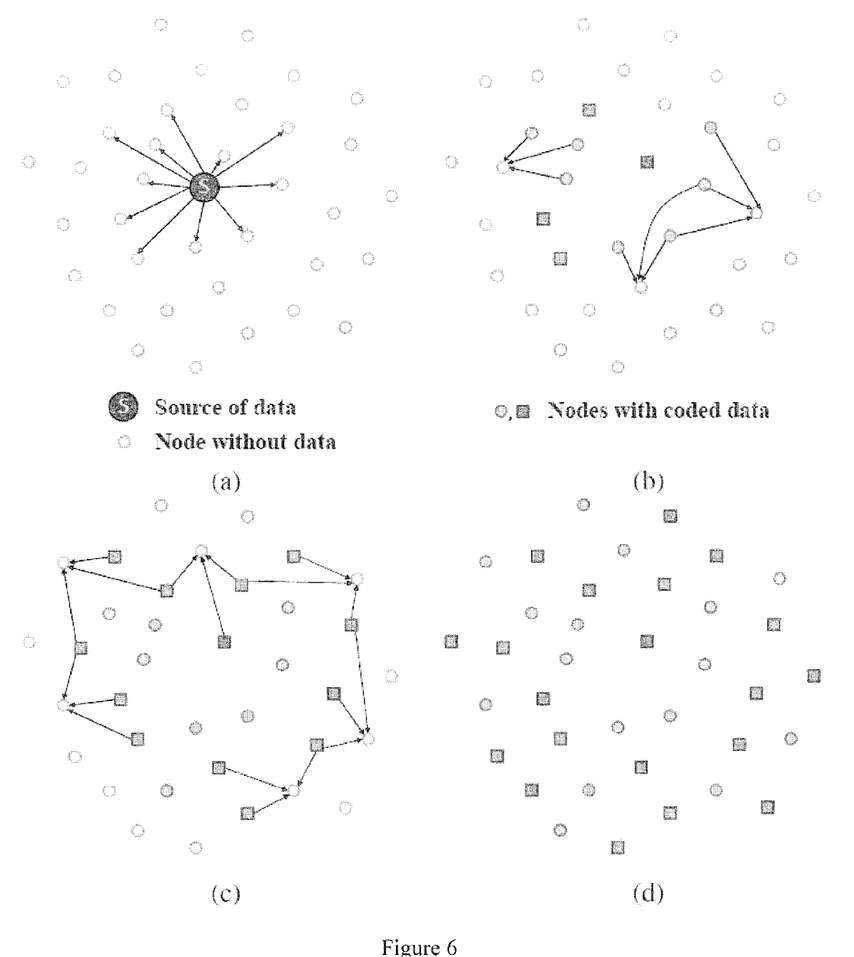
FIG. 6 illustrates data deployment using the Twin-code framework.

FIG. 6 illustrates data deployment using the Twin-code framework where (a) the point source transfers coded data to a subset of nodes. (b), (c) These nodes now help in the 'repair' of nodes in their neighbourhood that have not received data. The system eventually reaches a state as shown in (d).

Since the set of helper nodes form a feasible set of Type 1 nodes, it is clear that the replacement node can recover $\mu^t$ through erasure decoding of code $C_1$. Under our framework, $M_0 = M^t_1$ and hence, $$\mu(g^t_{(0,f)} M_1)^t = M_0 g_{(0,f)} \quad (39)$$

The vector μ thus comprises of precisely the k symbols required by the replacement node. In this manner, our repair algorithm requires a download equal to a fraction 1/k of the data download required during the data-reconstruction process.

The following are the advantages:

During regeneration of a failed node, the information passed on to the replacement node by a helper node is only a function of the index of the failed node. Thus, it is independent of the identity of the d−1 other nodes that are participating in the regeneration. Once again, this reduces the communication overhead by requiring less information to be disseminated.

Handling System Dynamics for any n: The system works for all values of n, and independent of the values of the parameters k and d. This makes the code constructions presented here practically appealing, as in any real-world distributed storage application such as a peer-to-peer storage, cloud storage, etc, expansion or shrinking of the system size is very natural. For example, in peer-to-peer systems, individual nodes are free to come and go at their own will.

The encoding matrix Ψ, for the codes described, can be chosen as a Vandermonde matrix. Then each node vector can be described by just a scalar. Moreover with this choice, the encoding, reconstruction, and regeneration operations are, for the most part, identical to encoding or decoding of conventional Reed-Solomon codes.

Dynamic Adaptation to the Network Bandwidths is achieved. The basic form of the proposed codes assumes a rather rigid structure, that of connecting to exactly k nodes and downloading all the data for reconstruction, and connecting to exactly d nodes for regeneration. The proposed codes can be easily enhanced to a highly flexible setup, where a data collector or a new node replacing a failed node can connect to a variable number of nodes and download different amounts of data from each node to which it connects to. In this way, it can make use of parallel downloading when it has a higher connectivity thereby making its download much faster. Also, when the links are not homogeneous, it can choose to downloads higher amounts from the nodes with faster link, and lesser from nodes with slower link.

The Case of Non-uniform storage spaces, that is when storage capacities of the nodes are different, each stripe can be encoded separately with a different n (and possibly a different k and d as well). A stripe will see only those storage nodes in which the data pertaining to that stripe is stored, thus seamlessly handling the case of variable α.

Recovering intermediate (Partial) Data is achieved. Since each stripe can be decoded independently, when only a small chunk of intermediate data is required, only the stripes containing the desired data can be decoded, instead of decoding the entire data.

Faster Downloads is achieved. In the distributed storage system, a data collector (replacement node) can trade the network usage to increase the download speed. Instead of sending download requests for reconstructing (or, regenerating) a stripe to some k (or, d) nodes, the data collector can send requests to some k+1 (or, d+1) nodes. Out of these, the k (or, d) parts of the stripe that arrive first can be used for reconstruction (regeneration), thereby decreasing the net time for data reconstruction (node regeneration).

For Parameters Not Conforming to Either variation: Variation 1 requires the minimum possible storage per, whereas the variation 2 point requires the minimum possible repair bandwidth per storage node (though the amount of storage is higher than the MSR point). Due to the striped nature of our system, the system can be operated at any intermediate point between via storage-space sharing.

REFERENCES

[1] D. A. Patterson, G. Gibson, and R. H. Katz, "A Case for Redundant Arrays of Inexpensive Disks (RAID)," in Proc. ACM SIGMOD international conference on management of data, Chicago, USA, June 1988, pp. 109-116.

[2] S. Rhea, P. Eaton, D. Geels, H. Weatherspoon, B. Zhao, and J. Kubiatowicz, "Pond: The OceanStore Prototype," in Proc. 2nd USENIX conference on File and Storage Technologies (FAST), 2003, pp. 1-14.

[3] R. Bhagwan, K. Tati, Y. C. Cheng, S. Savage, and G. M. Voelker, "Total Recall: System Support for Automated Availability Management," in Proc. 1st conference on Symposium on Networked Systems Design and Implementation (NSDI), 2004.

[4] A. G. Dimakis, P. B. Godfrey, M. Wainwright, and K. Ramchandran, "Network Coding for distributed storage systems," in Proc. $26^{th}$ IEEE International Conference on Computer Communications (INFOCOM), Anchorage, May 2007, pp. 2000-2008.

[5] Y. Wu, A. G. Dimakis, and K. Ramchandran, "Deterministic Regenerating codes for Distributed Storage," in Proc. 45th Annual Allerton Conference on Control, Computing, and Communication, Urbana-Champaign, September 2007.

[6] N. B. Shah, K. V. Rashmi, P. V. Kumar, and K. Ramchandran, "Explicit Codes Minimizing Repair Bandwidth for Distributed Storage," in Proc. IEEE Information Theory Workshop (ITW), Cairo, January 2010.

[7] C. Sub and K. Ramchandran, "Exact-Repair MDS Codes for Distributed Storage Using Interference Alignment," in Proc. IEEE International Symposium on Information Theory (ISIT), Austin, June 2010, pp. 161-165.

[8] Y. Wu, "Existence and Construction of Capacity-Achieving Network Codes for Distributed Storage," in IEEE Journal on Selected Areas in Communications, vol. 28, no. 2, 2010, pp. 277-288.

[9] A. G. Dimakis, P. B. Godfrey, Y. Wu, M. Wainwright, and K. Ramchandran, "Network Coding for Distributed Storage Systems," IEEE Transactions on Information Theory, vol. 56, no. 9, pp. 4539-4551, 2010.

[10] A. Duminuco and E. Biersack, "A Practical Study of Regenerating Codes for Peer-to-Peer Backup Systems," in Proc. 29th IEEE International Conference on Distributed Computing Systems (ICDCS), June 2009, pp. 376-384.

[11] Y. Wu and A. Dimakis, "Reducing Repair Traffic for Erasure Coding-Based Storage via Interference Alignment," in Proc. IEEE International Symposium on Information Theory (ISIT), Seoul, July 2009, pp. 2276-2280.

[12] K. V. Rashmi, N. B. Shah, P. V. Kumar, and K. Ramchandran, "Explicit Construction of Optimal Exact Regenerating Codes for Distributed Storage," in Proc. 47th Annual Allerton Conference on Communication, Control, and Computing, Urbana-Champaign, September 2009, pp. 1243-1249.

[13] D. Cullina, A. G. Dimakis, and T. Ho, "Searching for Minimum Storage Regenerating Codes," in Proc. 47th Annual Allerton Conference on Communication, Control, and Computing, Urbana-Champaign, September 2009.

[14] N. B. Shah, K. V. Rashmi, P. V. Kumar, and K. Ramchandran, "Interference Alignment in Regenerating Codes for Distributed Storage: Necessity and Code Constructions," IEEE Transactions on Information Theory, submitted for publication. [Online]. Available: arXiv:1005.1634v2 [cs.IT]

[15] Y. Wu, "A Construction of Systematic MDS Codes with Minimum Repair Bandwidth," IEEE Transactions on Information Theory, submitted for publication. [Online]. Available: arXiv:0910.2486 [cs.IT]

[16] V. R. Cadambe, S. A. Jafar, and H. Maleki, "Distributed Data Storage with Minimum Storage Regenerating Codes—Exact and Functional Repair are Asymptotically Equally Efficient." [Online]. Available: arXiv:1004.4299 [cs.IT]

[17] C. Suh and K. Ramchandran, "On the Existence of Optimal Exact-Repair MDS Codes for Distributed Storage." [Online]. Available: arXiv:1004.4663 [cs.IT]

[18] N. B. Shah, K. V. Rashmi, and P. V. Kumar, "A Flexible Class of Regenerating Codes for Distributed Storage," in Proc. IEEE International Symposium on Information Theory (ISIT), Austin, June 2010, pp. 1943-1947.

[19] N. B. Shah, K. V. Rashmi, P. V. Kumar, and K. Ramchandran, "Distributed Storage Codes with Repair-by-Transfer and Non-achievability of Interior Points on the Storage- Bandwidth Tradeoff," IEEE Transactions on Information Theory, submitted for publication. [Online]. Available: arXiv:1011.2361 [cs.IT]

[20] D. S. Bernstein, Matrix mathematics: Theory, facts, and formulas with application to linear systems theory. Princeton University Press, 2005.

[21] M. Maddah-Ali, A. Motahari, and A. Khandani, "Communication over MIMO X Channels: Interference Alignment, Decomposition, and Performance Analysis," IEEE Transactions on Information Theory, vol. 54, no. 8, pp. 3457-3470, 2008.

[22] V. Cadambe and S. Jafar, "Interference Alignment and Spatial Degrees of Freedom for the k User Interference Channel," IEEE Transactions on Information Theory, vol. 54, no. 8, pp. 3425-3441, August 2008.

[23] A. G. Dimakis, P. B. Godfrey, Y. Wu, M. Wainwright, and K. Ramchandran, "Network Coding for Distributed Storage Systems," IEEE Trans, on Inf. Theory, vol. 56, no. 9, pp, 4539-4551, 2010.

[24] K. V. Rashmi, N. B. Shah, and P. V. Kumar, "Optimal Exact-Regenerating Codes for the MSR and MBR Points via a Product-Matrix Construction," IEEE Trans. on Inf. Theory, submitted for publication. [Online]. Available: arxiv: 1005.4178 [cs.IT]

[25] Z. Wang, A. G. Dimakis, and J. Bruck, "Rebuilding for Array Codes in Distributed Storage Systems," in ACTEMT, December 2010.

[26] P. Elias, "Error-free Coding," IRE Transactions on Information Theory, vol. 4, no. 4, pp. 29-37, September 1954.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and devices within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity.

In addition, where features or aspects of the disclosure are described in terms of Markush groups, those skilled in the art will recognize that the disclosure is also thereby described in terms of any individual member or subgroup of members of the Markush group.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A system for replacing a failed node in a distributed data storage network, said system comprising:
   a new storage node replacing the failed node, comprising a repair block to download a predefined amount of data from a predetermined number of storage nodes for obtaining data that is stored in the failed node prior to failure, wherein total size of the downloaded data is less than size of source data in the distributed storage network; and
   a repair assisting block in each storage node in the distributed storage network to perform a predefined processing to obtain data that is downloaded by the repair block for replacing the failed nodes;
   wherein each storage node is associated with a corresponding encoding vector, an encoder of the system performs encoding of the source data based on the encoding vectors; upon demand entire source data is obtained at end user comprising data reconstruction block downloading data from a plurality of predetermined number of storage nodes and decoding the downloaded data.

2. A method of obtaining data stored in a failed storage node in a distributed storage network that performs replacement of said failed node by a new node, said method comprising:
   downloading predefined amount of data from a predetermined number of storage nodes, total size of the downloaded data being less than size of source data in the distributed storage network, said data is obtained by taking linear combinations of stored data in the predetermined number of storage nodes and an encoding vector associated with the failed node;
   obtaining data that is stored in the failed node prior to failure by performing an inversion operation on a matrix determined by encoding vectors of the predetermined number of storage nodes to obtain a resultant matrix and multiplying the resultant matrix with the data downloaded; and
   storing the obtained data in the new storage node, thereby replacing the failed storage node with the new storage node;
   wherein data stored in each storage node is obtained by encoding source data by associating each storage node with an encoding vector, constructing a message matrix and an encoding matrix with predefined properties, performing multiplication operation between the message matrix and the encoding matrix to obtain a resultant matrix and assigning each row of the resultant matrix to a storage node; upon demand entire source data is obtained by downloading data from a plurality of predetermined number of storage nodes and solving linear equations corresponding to the encoding vectors associated with the storage nodes from which data is downloaded.

3. The method as claimed in claim 2, wherein the predefined amount of data downloaded by the new storage node replacing a failed node is minimal compared to the conventional techniques.

4. The method as claimed in claim 2, wherein the encoded data is obtained based on one of minimum storage regeneration (MSR) and minimum bandwidth regeneration (MBR) techniques.

5. The method as claimed in claim 4, wherein encoding source data using the MSR technique comprises:
   constructing a message matrix consisting of predetermined number of rows and columns by stacking symmetric matrices of predetermined size, said message matrix comprises entire source data of the distributed storage network;
   performing an operation for setting a subset of elements of the message matrix as zero, said operation is performed for a predetermined relation between the number of nodes from which data is downloaded when obtaining entire source data and the number of nodes from which data is downloaded when replacing of a failed node with a new node;

obtaining a matrix of predetermined size with a predefined property of any subset of a predetermined number of rows being linearly independent as a first matrix, and obtaining another matrix by multiplying said first matrix with a diagonal matrix having a predefined property of all diagonal elements being distinct as a second matrix;

constructing an encoding matrix consisting of predetermined number of rows and columns by stacking of the first matrix and the second matrix, having a predefined property of any subset of a predetermined number of rows being linearly independent; and performing multiplication of the message matrix and the encoding matrix to obtain a resultant matrix and storing each row of the resultant matrix in a storage node.

6. The method as claimed in claim 4, wherein obtaining the data stored in a failed node prior to failure using the MSR technique comprises:

downloading a predetermined amount of data from a predetermined number of storage nodes, said data obtained by multiplying the data stored in each of the predetermined number of storage nodes with a predefined part of the encoding vector corresponding to failed node; and performing inversion operation on the rows of the encoding matrix associated with the storage nodes from which data is downloaded to obtain a resulting vector, and extracting a predefined part of said resulting vector as a first vector;

performing multiplication operation on other part of the resulting vector with diagonal element corresponding to the failed node in diagonal matrix used during the construction of the encoding matrix for obtaining a second vector; and performing addition operation of the first vector with the second vector to obtain the same data as stored in the failed node prior to failure.

7. The method as claimed in claim 4, wherein encoding source data using the MBR technique comprises:

obtaining a symmetric message matrix comprising predefined number of symmetric matrices, non-symmetric matrices, corresponding transpose matrices, and zero matrices, said message matrix comprises entire source data of the distributed storage network;

constructing an encoding matrix of predetermined size having two predefined properties of any subset of a predefined number of rows being linearly independent and any subset of predefined number of rows restricted to a predefined number of columns also being linearly independent; and multiplying the encoding matrix with the message matrix to obtain a resultant matrix and storing each row of the resultant matrix in a storage node.

8. The method as claimed in claim 4, wherein obtaining the data stored in a failed node prior to failure using the MBR technique comprises acts of:

downloading a predefined amount of data from a predetermined number of storage nodes, said data obtained by multiplying the data stored in each of the predetermined storage nodes with the encoding vector corresponding to the failed node;

performing inversion operation on the rows of the encoding matrix associated with the storage nodes from which data is downloaded to obtain a resulting vector; and performing transpose operation on the resulting vector.

9. The method as claimed in claim 2, wherein the encoded data is obtained using twin-code technique.

10. The method as claimed in claim 9, wherein encoding source data using the twin-code technique comprises acts of:

assigning each node in the distributed storage network with one of two types;

obtaining a message matrix consisting of predetermined number of rows and columns; said message matrix comprises entire source data of the distributed storage network;

constructing two encoding matrices consisting of predetermined number of rows and columns having a predefined property of any subset of predetermined number of rows being linearly independent;

multiplying the first encoding matrix with the message matrix to a obtain a resultant matrix and assigning each row of the resultant matrix to a storage node of the first type;

performing transpose operation on the message matrix to obtain transposed message matrix; and multiplying the second encoding matrix with the transposed message matrix to obtain a resultant matrix and assigning each row of the resultant matrix to a storage node of the second type.

11. The method as claimed in claim 9, wherein obtaining data stored in a failed node using the twin-code technique comprises:

downloading a predefined amount of data from a predetermined number of storage nodes of type other than the type of the failed node, said predefined amount of data is obtained by multiplying the data stored in each of the predetermined storage nodes with the encoding vector corresponding to the failed node;

performing inversion operation on the rows of the encoding matrix associated with the storage nodes of type other than the type of the failed node from which data is downloaded to obtain a resulting vector; and performing transpose operation on the resulting vector.

12. The method as claimed in claim 9, wherein upon demand entire source data is obtained comprising:

downloading data stored in a predetermined number of storage nodes, wherein all said storage nodes are of same type; and performing inversion operation on the rows of the encoding matrix associated with the nodes from which data is downloaded.

* * * * *